(12) United States Patent
Chiang et al.

(10) Patent No.: US 7,462,560 B2
(45) Date of Patent: Dec. 9, 2008

(54) PROCESS OF PHYSICAL VAPOR DEPOSITING MIRROR LAYER WITH IMPROVED REFLECTIVITY

(75) Inventors: Nien-Chung Chiang, Taipei (TW); Chih-Sheng Chang, Taipei Hsien (TW); Chun-Hsing Tung, Chang-Hua Hsien (TW); Yi-Tyng Wu, Chia-I (TW); Huai-Hsuan Tsai, Tai-Nan (TW); Chi-Rong Lin, Chang-Hua Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 219 days.

(21) Appl. No.: 11/161,649

(22) Filed: Aug. 11, 2005

(65) Prior Publication Data
US 2007/0037393 A1 Feb. 15, 2007

(51) Int. Cl.
*H01L 21/44* (2006.01)
(52) U.S. Cl. ........ 438/685; 438/636; 257/E21.582
(58) Field of Classification Search ......... 438/685; 257/E21.582, E21.585
See application file for complete search history.

(56) References Cited

U.S. PATENT DOCUMENTS

| 6,107,182 | A * | 8/2000 | Asahina et al. | 438/618 |
|---|---|---|---|---|
| 6,204,167 | B1 * | 3/2001 | Taniguchi | 438/627 |
| 6,656,528 | B2 * | 12/2003 | Ouellet et al. | 427/307 |
| 6,673,716 | B1 * | 1/2004 | D'Couto et al. | 438/656 |
| 6,920,195 | B2 * | 7/2005 | Ohishi et al. | 378/10 |
| 6,969,448 | B1 * | 11/2005 | Lau | 204/192.17 |
| 2001/0004534 | A1 | 6/2001 | Carter-Coman | |
| 2003/0228746 | A1 * | 12/2003 | Lee et al. | 438/586 |
| 2004/0135166 | A1 * | 7/2004 | Yamada et al. | 257/103 |
| 2004/0242007 | A1 * | 12/2004 | Hahn et al. | 438/700 |
| 2005/0089924 | A1 * | 4/2005 | Ho et al. | 435/7.1 |
| 2006/0145177 | A1 * | 7/2006 | Hagimoto et al. | 257/99 |

FOREIGN PATENT DOCUMENTS

| JP | 2002140911 A | | 5/2002 |
|---|---|---|---|
| JP | 2004266039 A | * | 9/2004 |
| KR | 20020045484 | | 6/2002 |

* cited by examiner

*Primary Examiner*—Marcos D. Pizarro
*Assistant Examiner*—Igwe U. Anya
(74) *Attorney, Agent, or Firm*—Winston Hsu

(57) ABSTRACT

A process of physical vapor depositing mirror layer with improved reflectivity is disclosed. A wafer is loaded into a PVD tool comprising a degas chamber, a Ti/TiN sputter deposition chamber, a cooling chamber, and an aluminum sputter deposition chamber. A wafer degas process is first performed within the degas chamber. The wafer is then transferred to the Ti/TiN sputter deposition chamber and deposition sputtering a layer of titanium onto the wafer. The wafer is transferred to the cooling chamber and gas cooling the wafer temperature down to 40-50° C. The wafer is then transferred to the aluminum sputter deposition chamber and deposition sputtering a layer of aluminum onto the wafer at 40-50° C. with a backside gas turned off. The deposited layer of aluminum over the wafer has a reflectivity of about 0.925 at wavelength of around 380 nm.

9 Claims, 5 Drawing Sheets

PROCESS OF PHYSICAL VAPOR DEPOSITING MIRROR LAYER WITH IMPROVED REFLECTIVITY

BACKGROUND OF THE INVENTION

1. Field of the Invention

The present invention relates to an improved physical vapor deposition (PVD) process for forming mirror layer with improved reflectivity.

2. Description of the Prior Art

Micro-display devices such as digital light processing (DLP) or LCOS projection units require a mirror layer to reflect image light signals. Such mirror layer is typically made of thin metal layers or high-reflectivity materials. Thin aluminum mirror layer is commonly used because aluminum is relatively inexpensive compared to other mirror materials, and because of its relatively higher reflectivity. To form an aluminum mirror layer of a micro-display device, pure aluminum is evenly sputtered onto the wafer surface using physical vapor deposition (PVD) methods As known in the art, PVD is mainly a physical, rather than chemical, process. In PVD, atoms of a heavy, but inert gas, typically argon, are electrically accelerated toward a target of pure metal. These atoms chip off or sputter the target material, atom by atom. The sputtered metal having high temperatures lands on the wafer surface, where it forms a solid layer of metal, and increases the temperature of the wafer. Thereafter, this metal layer is patterned and etched to form pixel mirrors of a semiconductor image device.

The aforesaid aluminum mirror layer is deposited in PVD process chambers which is capable of providing a vacuum environment with high substrate temperature (380-500° C.), thus the metal atoms deposited on the wafer become crystallized grains. It is often desirable to form an aluminum layer with relatively higher reflectivity through spectrum. The prior art aluminum mirror layer deposited using traditional PVD process has a drawback in that the formed aluminum mirror layer has an obvious abrupt drop of reflectivity at a wavelength around 380 nm, which is difficult to improve.

SUMMARY OF THE INVENTION

It is the primary object of the present invention to provide an improved physical vapor deposition (PVD) process for sputter depositing mirror layer with improved reflectivity.

According to the claimed invention, a process of physical vapor depositing mirror layer with improved reflectivity is disclosed. A wafer is loaded into a PVD tool comprising multiple chambers comprising a degas chamber, a Ti/TiN sputter deposition chamber, a cooling chamber, and an aluminum sputter deposition chamber. A wafer degas process is first performed within the degas chamber to pre-clean the wafer. The wafer is then transferred to the Ti/TiN sputter deposition chamber and deposition sputtering a layer of titanium or titanium nitride onto the wafer, thereby raising temperature of the wafer to about 200-300° C. The wafer is then transferred to the cooling chamber and gas cooling the wafer temperature down to 40-50° C. The wafer is then transferred to the aluminum sputter deposition chamber and deposition sputtering a layer of aluminum onto the wafer at 40-50° C. with a backside gas turned off. The deposited layer of aluminum over the wafer has a reflectivity of about 0.925 at wavelength of around 380 nm.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
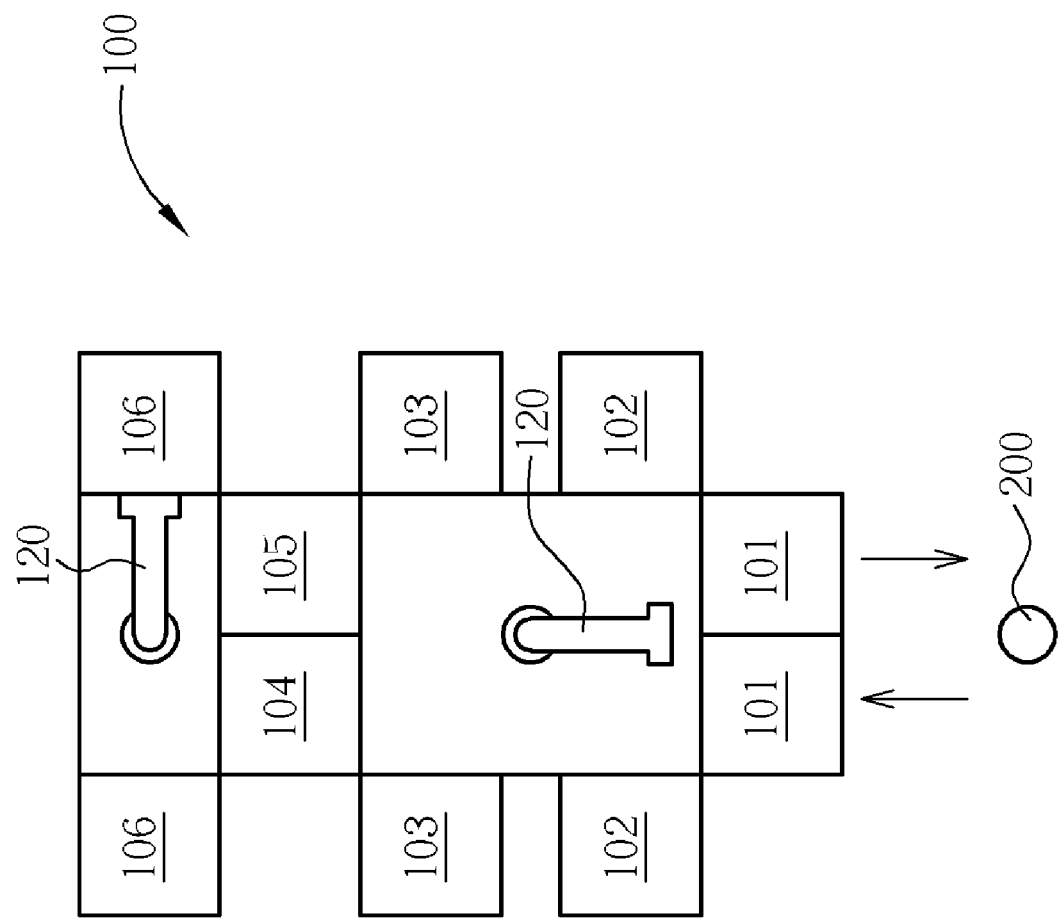
FIG. 1 is a schematic plan view of a cluster PVD tool layout in accordance with one preferred embodiment of this invention.

In describing the preferred embodiment of the present invention, reference will be made herein to FIGS. 1-4 of the drawings. Features of the invention are not necessarily drawn to scale in the drawings.

The exemplary preferred embodiment is implemented in a cluster PVD tool, which is available from vendors such as Applied Materials, Inc. However, the persons skilled in the art will recognize that the present invention may be used in other PVD systems such as batch type PVD system. Cluster tools are commonly used to perform multiple process steps on a series of single wafer or samples and therefore may improve process control and cycle time compared a batch processor.

Figure 2:
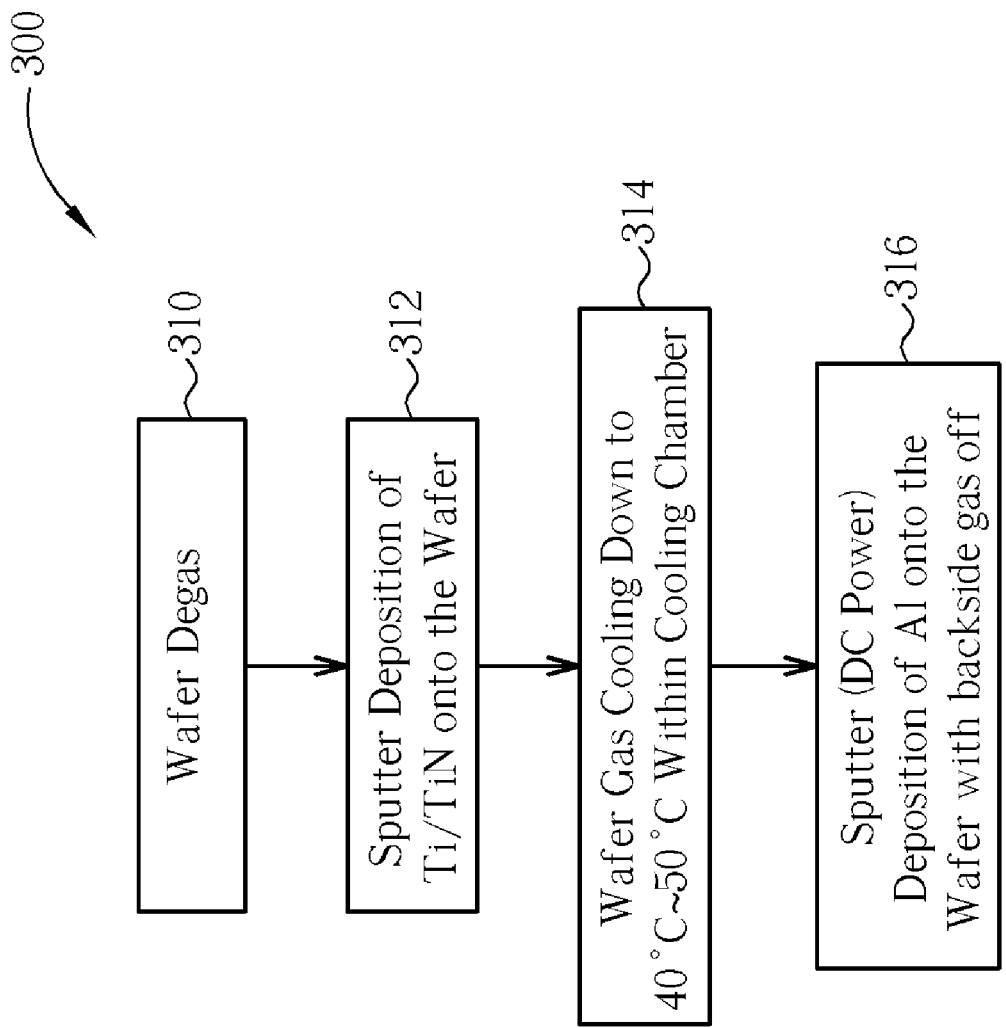
FIG. 2 is a flow chart showing the key steps of the preferred embodiment.

Please refer to FIG. 1 and FIG. 2. FIG. 1 is a schematic plan view of a cluster PVD tool layout 100 in accordance with one preferred embodiment of this invention, and FIG. 2 is a flow chart 300 showing the key steps of the preferred embodiment. In FIG. 1, the cluster PVD tool 100 consists of multiple chambers for different processes. The cluster PVD tool usually has central robots 120 to feed multiple process chambers. In operation, the chambers, and the space where the central robots 120 are located, are maintained at high degrees of vacuum.

According to the exemplary preferred embodiment, chambers 101 are loading/un-loading chambers for receiving a wafer to be processed or a processed wafer to be transferred out. Chambers 102 are degas chambers. Chambers 103 are Ti/TiN sputter deposition chambers. Chamber 104 is a cooling chamber for implementing the wafer cooling. Chamber 105 is a buffer chamber. Chambers 106 are Al sputter deposition chambers.

Figure 3:
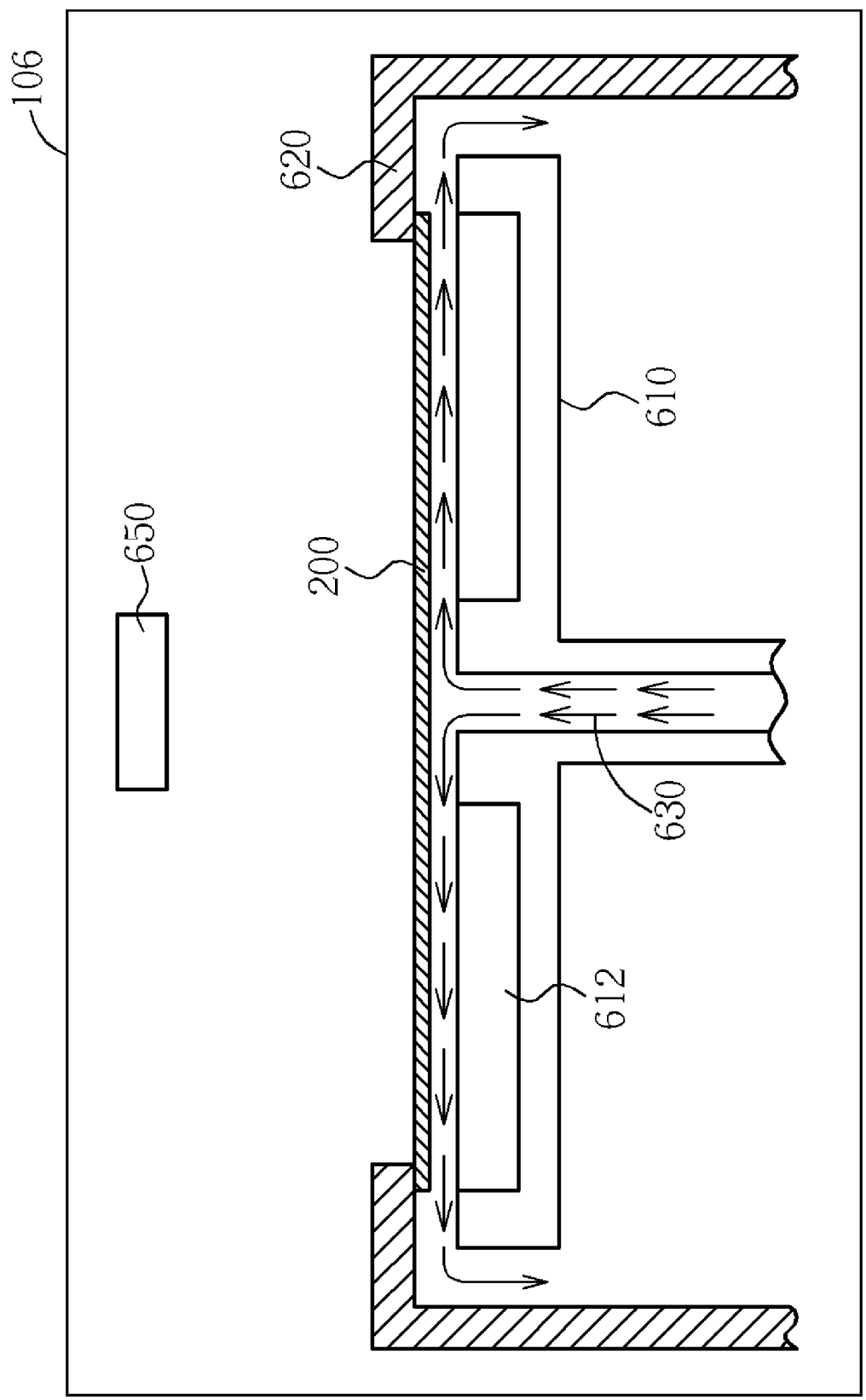
FIG. 3 is a schematic, cross-sectional diagram showing the layout of the chamber in accordance with the preferred embodiment.

Please refer to FIG. 3. FIG. 3 is a schematic, cross-sectional diagram showing the layout of the Al sputter deposition chamber 106 in accordance with the preferred embodiment. The Al sputter deposition chamber 106 comprises a wafer stage 610 having a flat main surface for resting the wafer 200. The wafer stage 610 has a heating means 612 for uniformly and rapidly heating the wafer 200 during the PVD process. A clamping member 620 clamps the periphery of the wafer 200. The wafer stage is capable of providing a flow of inert gas (hereinafter referred to as "backside gas") 630 to purge the backside of the wafer 200 in order to improve the heating uniformity of the wafer through convection. A target 650 of material such as aluminum is situated directly above the wafer 200. DC power supply is not shown in the figure.

As shown in FIG. 2, and briefly back to FIG. 1, the wafer 200 is first transferred into one of the loading/un-loading chambers 101. After the wafer 200 is placed in a vacuum environment, the central robot 120 moves the wafer to the next chamber, degas chamber 102. In the degas chamber 102, the wafer undergoes a degas process for pre-cleaning contaminations from a pre-layer process (Step 310). After degassing, the wafer 200 is then transferred to chamber 103. In chamber 103, a layer of Ti or TiN is sputtered onto the wafer 200 (Step 312). The temperature of the wafer 200 now raises to about 200-300° C.

The wafer bearing the layer of Ti or TiN is immediately transferred into the cooling chamber 104. Once the wafer 200 of high temperature is loaded into the chamber 104, a flow of inert gas (cooling gas) such as argon, helium or nitrogen is flowed into the chamber 104 to cooling down the temperature of the wafer 200 from 200-300° C. down to room temperature (about 25° C.) to 80° C., preferably about 40-50° C. (Step 314). According to the preferred embodiment of this invention, the flowrate of the argon cooling gas ranges between 20-100 sccm, preferably 30-50 sccm, for a time period of about 80-150 seconds.

As shown in FIG. 2, and briefly back to FIG. 3, after cooling the wafer down to about 40-50° C., the wafer 200 is immediately transferred into the chamber 106 to implement aluminum sputter PVD deposition (Step 316). In aluminum sputter PVD, a DC power source of about 9000-11000 Watts is provided and results in metal target 650 with a negative bias and the wafer 200 with a positive bias causing unidirectional plasma current from the wafer to the target. In another case, pulsed sputtering which is a DC sputtering process where the power source is pulsed may be employed.

Argon gas (ion source) is flowed into the chamber 106 at a flowrate of about 30-90 sccm. It is an important feature of the present invention that during the sputter deposition of aluminum, the backside gas 630 is deliberately turned off. The heating means 612 maintains at a temperature of about 300-400° C. Under the above-described process conditions, a thin layer of aluminum of about 1000-3000 angstroms is sputtered and deposited onto the wafer 200 in approximately 5-50 seconds (deposition rate 150-200 angstroms/second).

The present invention features the cooling step (Step 314 of FIG. 2) prior to the aluminum sputter PVD. Since the wafer is cooled down to about 40-50° C., the aluminum atoms sputtered onto the wafer surface has lower surface mobility, thereby forming a layer of aluminum mirror layer that has smaller crystal grains and evener surface. The reflectivity of the mirror layer is thus enhanced.

Figure 4:
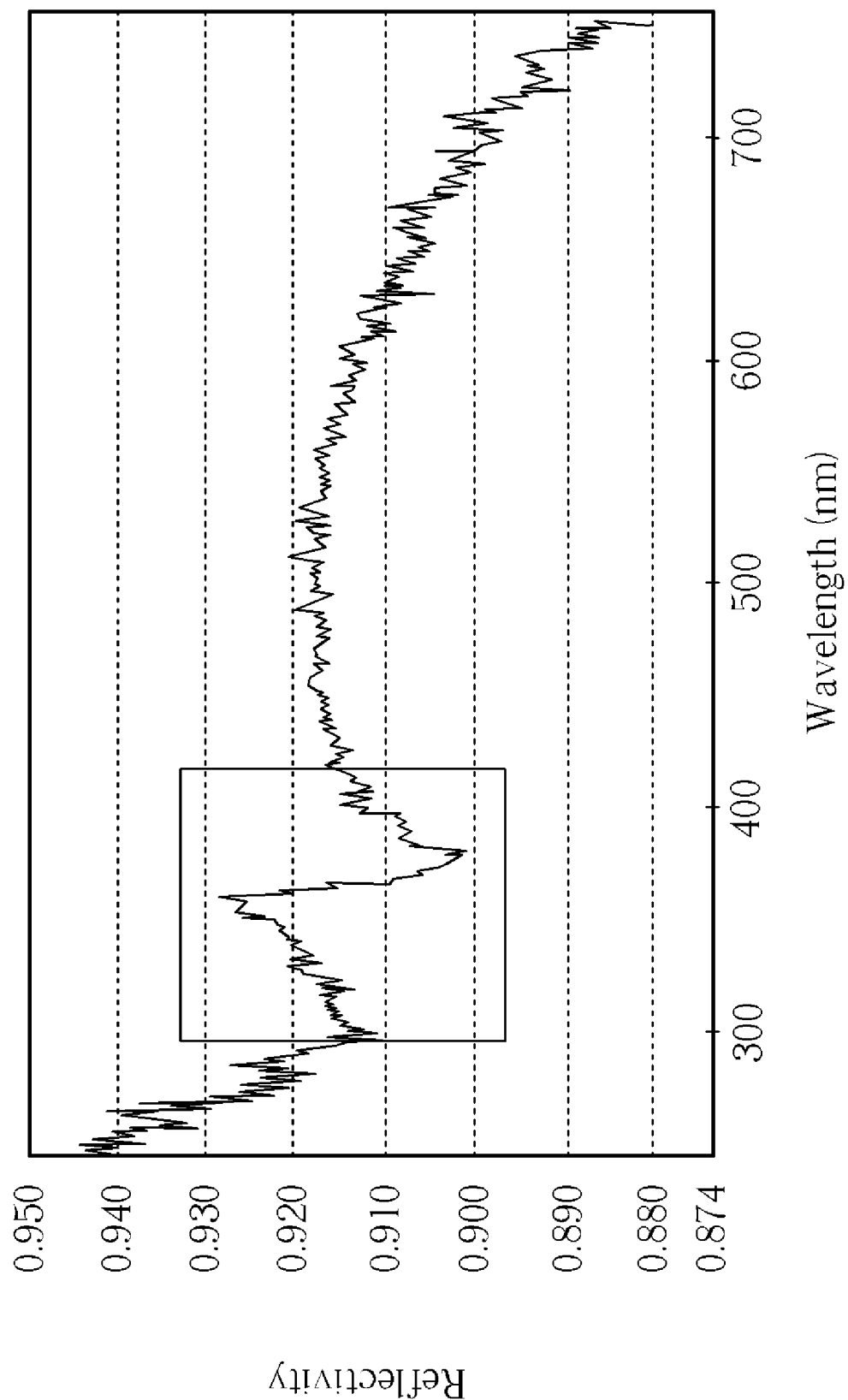
FIG. 4 is a curve of reflectivity vs. wavelength according to prior art.
Figure 5:
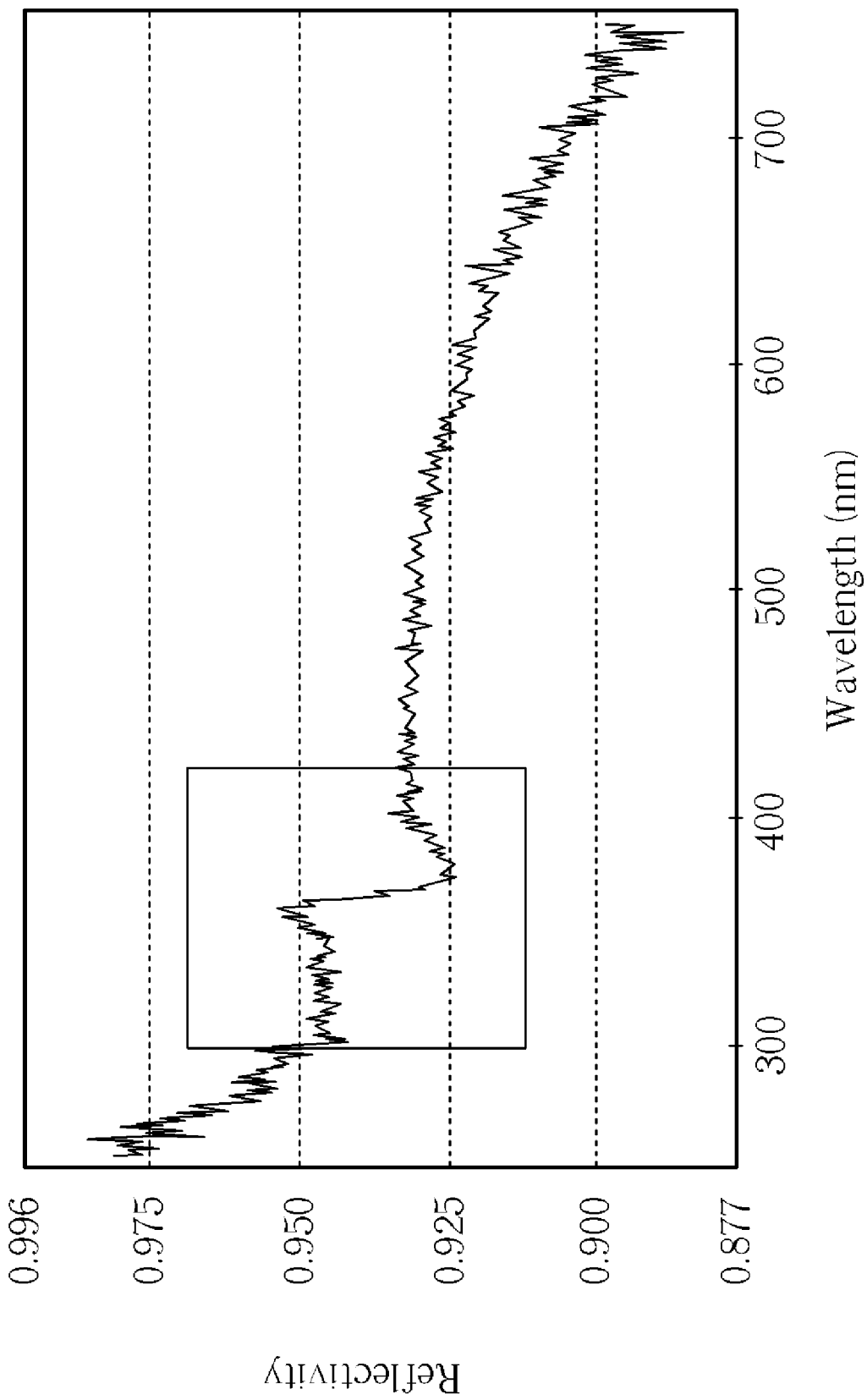
FIG. 5 is a curve of reflectivity vs. wavelength according to this invention.

FIG. 4 and FIG. 5 illustrate the improvement of reflectivity of the sputter aluminum mirror layer, wherein FIG. 4 is a curve of reflectivity vs. wavelength according to prior art. FIG. 5 is a curve of reflectivity vs. wavelength according to this invention, both of which are measured by using a dual-beam spectrometer (DBS) tool. Using this invention method, a 2-3% gain is obtained in the short wavelength region (300-400 nm). As can be seen at wavelength around 380 nm, the reflectivity is increased from about 0.9 up to 0.925.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A process of physical vapor depositing mirror layer with improved reflectivity, comprising:
    loading a wafer into a PVD tool comprising a degas chamber, a Ti/TiN sputter deposition chamber, a cooling chamber, and a aluminum sputter deposition chamber;
    performing a wafer degas process within the degas chamber to pre-clean the wafer;
    transferring the wafer to the Ti/TiN sputter deposition chamber and deposition sputtering a layer of titanium or titanium nitride onto the wafer; and
    transferring the wafer to the aluminum sputter deposition chamber and during deposition sputtering a layer of aluminum onto the wafer at 40-50° C. to form the physical vapor depositing mirror layer, a backside gas is off, wherein the surface of the physical vapor depositing mirror layer is formed when the backside gas is off.

2. The process of physical vapor depositing mirror layer with improved reflectivity according to claim 1 wherein the aluminum sputter deposition chamber comprises a wafer stage, a heating means installed on the wafer stage, and a damper for clamping the wafer on the wafer stage.

3. The process of physical vapor depositing mirror layer with improved reflectivity according to claim 1 wherein when deposition sputtering the layer of aluminum onto the wafer, a DC power source of about 9000-11000 Watts is provided.

4. The process of physical vapor depositing mirror layer with improved reflectivity according to claim 1 wherein when deposition sputtering the layer of aluminum onto the wafer, argon gas is flowed into the aluminum sputter deposition chamber at a flowrate of about 30-90 sccm.

5. The process of physical vapor depositing mirror layer with improved reflectivity according to claim 1 wherein the deposited layer of aluminum has a thickness of about 1000-3000 angstroms deposited in approximately 5-50 seconds.

6. The process of physical vapor depositing mirror layer with improved reflectivity according to claim 1 wherein the deposited layer of aluminum has a reflectivity of about 0.925 at wavelength of around 380 nm.

7. The process of physical vapor depositing mirror layer with improved reflectivity according to claim 1, after deposition sputtering a layer of titanium or titanium nitride onto the wafer and before deposition sputtering a layer of aluminum onto the wafer, further comprising:
    transferring the wafer to the cooling chamber and gas cooling the wafer temperature down to room temperature (about 25° C.) to 80° C. by using a cooling gas.

8. The process of physical vapor depositing mirror layer with improved reflectivity according to claim 7, wherein the wafer temperature is gas cooled down to 40-50° C. by using a cooling gas.

9. The process of physical vapor depositing mirror layer with improved reflectivity according to claim 7 wherein the cooling gas comprises argon, helium and nitrogen.

\* \* \* \* \*